United States Patent
Bulzacchelli et al.

(10) Patent No.: US 8,941,415 B2
(45) Date of Patent: Jan. 27, 2015

(54) EDGE SELECTION TECHNIQUES FOR CORRECTING CLOCK DUTY CYCLE

(71) Applicant: International Business Machines Corporation, Armonk, NY (US)

(72) Inventors: John F. Bulzacchelli, Yonkers, NY (US); Ankur Agrawal, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/151,998

(22) Filed: Jan. 10, 2014

(65) Prior Publication Data

US 2014/0125382 A1    May 8, 2014

Related U.S. Application Data

(63) Continuation of application No. 13/947,224, filed on Jul. 22, 2013, now Pat. No. 8,686,764, which is a continuation of application No. 13/534,596, filed on Jun. 27, 2012, now abandoned, which is a continuation of application No. 13/534,241, filed on Jun. 27, 2012, now abandoned.

(60) Provisional application No. 61/597,501, filed on Feb. 10, 2012.

(51) Int. Cl.
  *H03K 17/00*   (2006.01)
  *H03K 5/156*   (2006.01)
  *H03K 3/017*   (2006.01)

(52) U.S. Cl.
  CPC ............ *H03K 17/005* (2013.01); *H03K 5/1565* (2013.01); *H03K 3/017* (2013.01)
  USPC .......................................................... 327/99

(58) Field of Classification Search
  USPC .......................................................... 327/175
  See application file for complete search history.

(56) References Cited

U.S. PATENT DOCUMENTS

| | | | |
|---|---|---|---|
| 6,111,442 A | 8/2000 | Aulet et al. | |
| 6,642,760 B1 | 11/2003 | Alon et al. | |
| 6,744,289 B2 | 6/2004 | Nguyen et al. | |
| 6,874,097 B1 | 3/2005 | Aliahmad et al. | |
| 7,292,670 B2 | 11/2007 | Gupta et al. | |
| 7,385,428 B2 | 6/2008 | Lee et al. | |
| 7,514,991 B2 | 4/2009 | Schnarr | |
| 7,560,963 B2 | 7/2009 | Yun et al. | |
| 7,613,266 B1 | 11/2009 | Talbot | |
| 7,755,405 B2 | 7/2010 | Yun et al. | |
| 7,782,106 B2 | 8/2010 | Shin et al. | |
| 2009/0251184 A1* | 10/2009 | Park | 327/175 |
| 2011/0254595 A1 | 10/2011 | Sun | |

* cited by examiner

*Primary Examiner* — Daniel Rojas
(74) *Attorney, Agent, or Firm* — Anne V. Dougherty; Ryan, Mason & Lewis, LLP

(57) ABSTRACT

Circuits and methods are provided for generating clock signals and correcting duty cycle distortion in clock signals. A circuit for generating a clock signal includes a multiplexer circuit and an edge-triggered flip-flop circuit. The multiplexer circuit selectively outputs one of a plurality of input clock signals. The edge-triggered flip-flop detects a transitioning edge of the input clock signal that is selectively output from the multiplexer circuit, and in response to the detection, samples a logic level of a received data signal, and generates a transition of an output clock signal at an output port of the edge-triggered flip-flop. The multiplexer circuit selectively outputs one of the plurality of input clock signals to a clock signal port of the edge-triggered flip-flop, based on a logic level of the output clock signal at the output port of the edge-triggered flip-flop, which is input to a select control port of the multiplexer circuit.

15 Claims, 7 Drawing Sheets

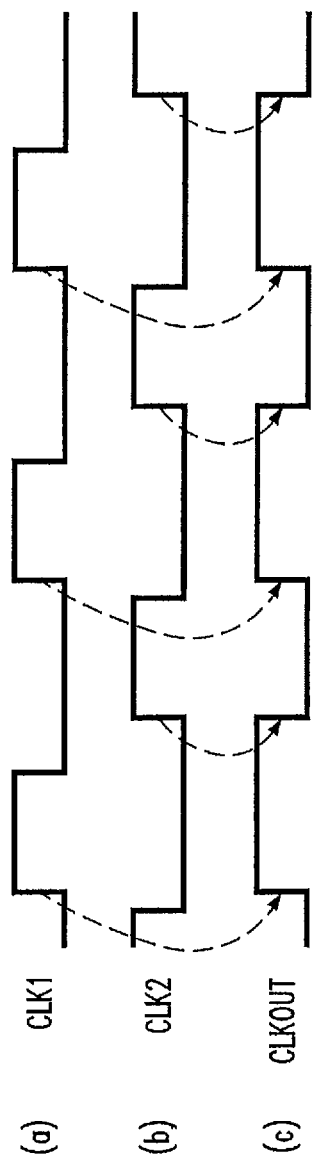

30

40

EDGE SELECTION TECHNIQUES FOR CORRECTING CLOCK DUTY CYCLE

CROSS-REFERENCE TO RELATED APPLICATIONS

This application is a Continuation of U.S. patent application Ser. No. 13/947,224, filed on Jul. 22, 2013, now U.S. Pat. No. 8,686,764, which is a Continuation of U.S. patent application Ser. No. 13/534,596, filed on Jun. 27, 2012, now abandoned, which is a Continuation of U.S. patent application Ser. No. 13/534,241, filed on Jun. 27, 2012, now abandoned, which claims priority to U.S. Provisional Patent Application Ser. No. 61/597,501, filed on Feb. 10, 2012, the disclosures of which are incorporated herein by reference.

STATEMENT REGARDING FEDERALLY SPONSORED RESEARCH OR DEVELOPMENT

This invention was made with Government support under Contract No.: H98230-07-C-0409 (National Security Agency (NSA)). The Government has certain rights in this invention.

TECHNICAL FIELD

The field generally relates to circuits and methods for generating clock signals, and in particular, edge selection circuits and methods for correcting duty cycle distortion in clock signals.

BACKGROUND

In some analog, digital, and mixed-signal systems, critical timing information is present only on one of rising or falling transitions of timing signals such as clock signals. Some of these systems may need to synthesize an output clock signal from two input clock signals, such that the output clock signal transitions on every useful transition of the two input clock signals. Edge selection circuits can be employed for the purpose of synthesizing an output clock from two input clock signals.

For example, FIG. 1 is a timing diagram that generally illustrates an exemplary mode of operation of an edge selection circuit. In FIG. 1, waveform (a) shows a first clock signal CLK1, waveform (b) shows a second clock signal CLK2, and waveform (c) shows an output clock signal CLKOUT that is generated from the two input clock signals. In particular, in FIG. 1, it is assumed that the two input clock signals CLK1 and CLK2 have rising transitions that contain timing information of interest to a given system. The output clock signal CLKOUT is derived from CLK1 and CLK2 such that the rising and falling edges of CLKOUT correspond to the rising edges of CLK1 and CLK2, respectively, as indicated by the dashed arrows.

In many circuits, the overall system performance may be degraded if a clock duty cycle deviates from 50%. For instance, in a high-speed I/O receiver incorporating a half-rate architecture, it is important that the clock have 50% duty cycle for the even and odd data bits to be sampled at uniform time intervals. Otherwise, it would be impossible to find a sampling clock position which is ideal for both even and odd data bits, and the timing margin for detecting error-free data will be eroded. Unfortunately, some circuits (such as CMOS phase interpolators) may generate output clock waveforms with duty cycle distortion while accomplishing their functions.

In order to utilize the functions of such circuits without negative effects on system performance, it is desirable to have a technique capable of correcting such duty cycle distortion. If complementary clocks are processed by identical circuits (e.g., phase interpolators), their outputs may have distorted (non-50%) duty cycles. But to the extent that the circuits (and therefore the duty cycles) match, the time spacing from the rising edge of one output to the rising edge of the other output may be exactly one half clock period. In this case, an attractive option for synthesizing a clock with 50% duty cycle is to select only the rising edges of the distorted signals in constructing the final output waveform. An edge selection technique may be especially useful for correcting duty cycle distortion in clock signals.

SUMMARY

Exemplary embodiments of the invention generally include circuits and methods for generating clock signals, and in particular, edge selection circuits and methods for correcting duty cycle distortion in clock signals.

In one exemplary embodiment of the invention, a circuit for generating a clock signal includes a multiplexer circuit and an edge-triggered flip-flop circuit. The edge-triggered flip-flop circuit includes a clock signal port, a data signal port, and an output port. The clock signal port is connected to an output of the multiplexer circuit, the data signal port receives a data signal, and the output port of the edge-triggered flip-flop is connected to a select control port of the multiplexer circuit. The multiplexer circuit selectively outputs one of a plurality of input clock signals. The edge-triggered flip-flop detects a transitioning edge of the input clock signal that is selectively output from the multiplexer circuit, and in response to the detection, samples a logic level of the received data signal, and generates a transition of an output clock signal at the output port. The multiplexer circuit selectively outputs one of the plurality of input clock signals to the clock signal port of the edge-triggered flip-flop, based on a logic level of the output clock signal at the output port of the edge-triggered flip-flop, which is input to the select control port of the multiplexer circuit.

In another exemplary embodiment of the invention, a method is provided for generating a clock signal. The method includes selecting between one of a plurality of input clock signals, based on a logic level of an output clock signal; detecting a transitioning edge of the selected one of the plurality of input clock signals; sampling a logic level of a data signal in response to the detecting; changing the logic level of the output clock, based on the sampled logic level of the data signal; and selecting another one of the plurality of input clock signals, in response to the changing of the logic level of the output clock. In an exemplary embodiment of the invention where the plurality of input clock signals includes a first input clock signal and a second input clock signal, the sequence of the selecting, detecting, sampling, changing and selecting steps is repeated, wherein the first input clock signal is selected when the output clock signal transitions to a first logic level and wherein the second input clock signal is selected when the output clock signal transitions to a second logic level.

These and other exemplary embodiments, aspects and features of the present invention will become apparent from the following detailed description of exemplary embodiments thereof, which is to be read in connection with the accompanying drawings.

BRIEF DESCRIPTION OF THE DRAWINGS

FIG. 1 is a timing diagram that illustrates an operational mode of edge selection circuits.

DETAILED DESCRIPTION OF EXEMPLARY EMBODIMENTS

Exemplary embodiments will now be discussed in further detail with regard to circuits and methods for generating clock signals, and in particular, edge selection circuits and methods for correcting duty cycle distortion in clock signals.

Figure 2A:
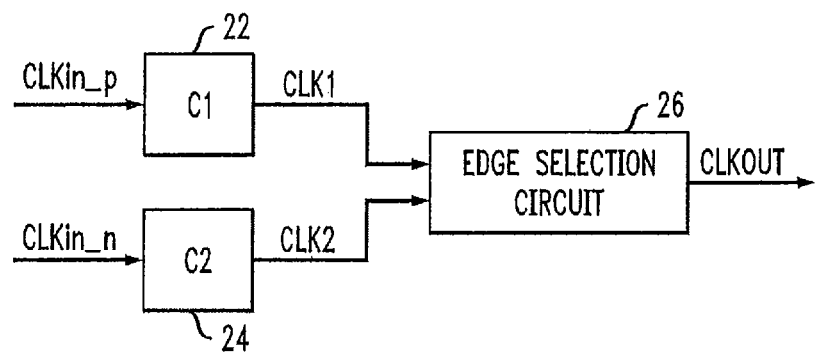
FIG. 2A is a functional block diagram of a circuit for correcting duty cycle distortion using an edge selection circuit.
Figure 2B:
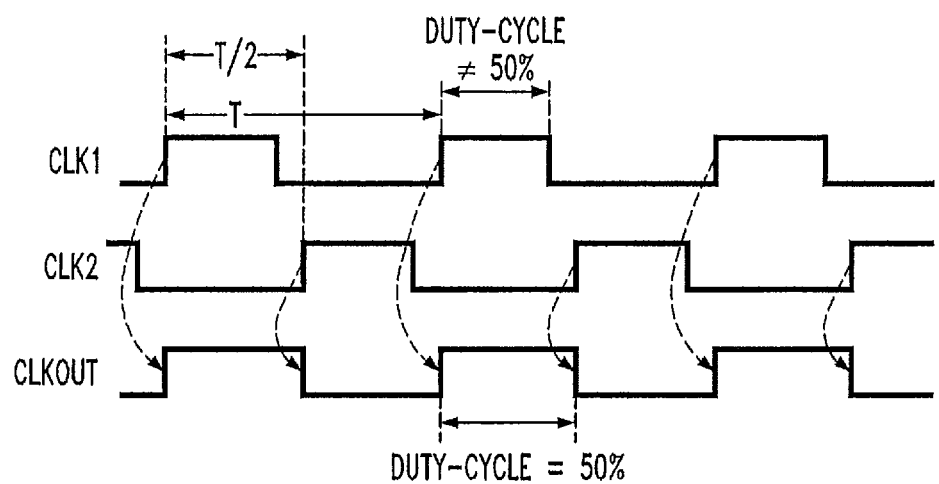
FIG. 2B is a timing diagram that illustrates a mode of operation of the circuit of FIG. 2A.

FIG. 2A is a functional block diagram of a circuit for correcting duty cycle distortion using an edge selection circuit. FIG. 2B is a timing diagram that illustrates a mode of operation of the circuit of FIG. 2A. FIG. 2A shows two identical circuits 22 and 24 that act upon complementary input clocks, CLKin_p and CLKin_n, to produce output clocks CLK1 and CLK2, respectively. An edge selection circuit 26 receives as input the clock signals CLK1 and CLK2, and outputs a clock signal CLKOUT, which is synthesized from the two input clocks CLK1 and CLK2. More specifically, as shown in the timing diagram of FIG. 2B, the clock signals CLK1 and CLK2 do not have 50% duty cycle, but their rising edges are exactly one-half a clock period (T/2) apart. The edge selection circuit 26 constructs the output clock CLKOUT from the rising edges of the input clocks CLK1 and CLK2 (as indicated by the dashed arrows) such that the CLKOUT signal has a 50% duty cycle.

Figure 3:
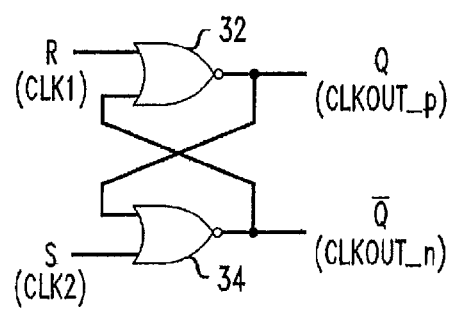
FIG. 3 is a schematic diagram of an S-R latch that is configured as an edge selection circuit.

FIG. 3 is a schematic diagram of a set-reset (S-R) latch 30 that is used as an edge selection circuit. The S-R latch 30 in FIG. 3 can be used to implement the edge selection circuit 26 of FIG. 2A. The S-R latch 30 comprises a first NOR gate 32 and a second NOR gate 34 which are connected in a cross-coupled configuration. The first NOR gate 32 has a first input R (reset) that receives the clock signal CLK1 and a second input that receives an output CLKOUT_n of the second NOR gate 34. The second NOR gate has a first input S (set) that receives the clock signal CLK2 and a second input that receives an output CLKOUT_p of the first NOR gate 32. The S-R latch circuit 30 is inherently asymmetric, because CLKOUT_p and CLKOUT_n never transition at the same time instant. While the falling transitions of the output clocks occur one gate-delay after the input clock transitions, the rising transitions occur after two gate-delays. Moreover, for the circuit 30 to properly operate as a duty cycle corrector, the input clock duty cycles must be less than 50%. When both input clocks are high simultaneously, CLKOUT_p and CLKOUT_n are both pulled low, and the desired repairing of the duty cycle will not be achieved.

Figure 4A:
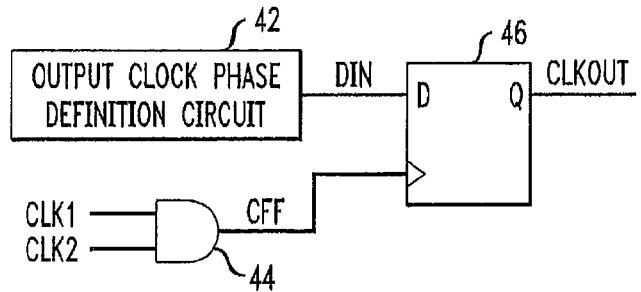
FIG. 4A is a schematic diagram of an edge selection circuit comprising combinatorial logic followed by a flip-flop.
Figure 4B:
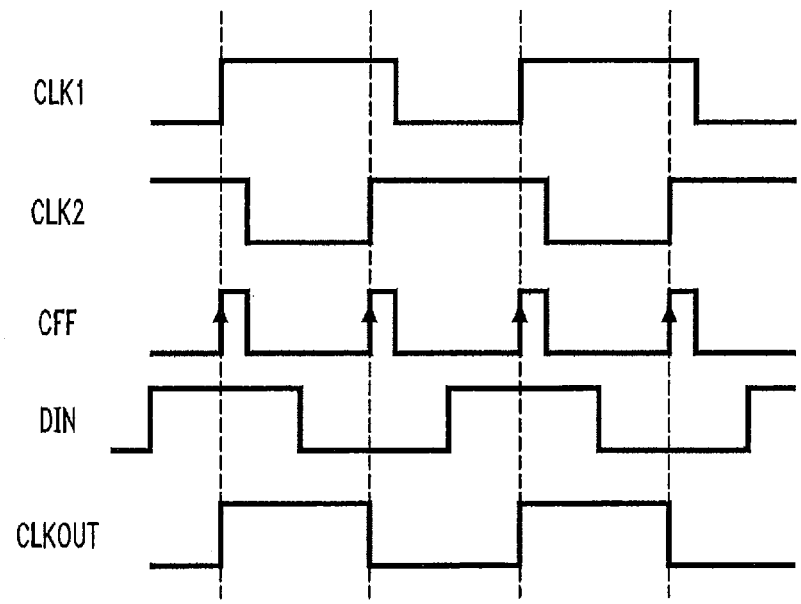
FIG. 4B is a timing diagram that illustrates a mode of operation of circuit of FIG. 4A.

FIG. 4A is a schematic diagram of an edge selection circuit comprising combinatorial logic followed by a flip-flop. FIG. 4B is a timing diagram that illustrates a mode of operation of the circuit of FIG. 4A. As shown in FIG. 4A, an edge selection circuit 40 comprises an output clock phase definition circuit 42, combinational logic 44 (AND gate), and a D flip-flop 46 (or data flip-flop). The combinational logic generates a clock signal CFF by logically AND-ing the two input clock signals CLK1 and CLK2. As shown in FIG. 4B, the signal CFF that is output from the AND gate 44 will be logic "high" when both clock signals CLK1 and CLK2 are logic "high".

The signal CFF serves as a clock signal for the D flip-flop 46. The D flip-flop 46 captures the value of the D-input (DIN) at a defined instant of the cycle of the signal CFF (such as the rising edge of CFF). The captured value becomes the Q output CLKOUT. This is shown in FIG. 4B, wherein upon each rising edge of the clock signal CFF, the CLKOUT signal transitions to a logic level that is the same as the logic level of the DIN signal. The data input (DIN) to the flip-flop 46 is a signal that is generated by the output clock phase definition circuit 42 to ensure that the CLKOUT signal has a correct phase relationship with respect to CLK1 and CLK2. However, the edge selection circuit 40 makes certain assumptions about the input clocks. CLK1 and CLK2 need to have duty cycles greater than 50%. Also, as the duty cycles of CLK1 and CLK2 approach 50%, the CFF pulses become narrower and may eventually become runt pulses for the flip-flop 46, resulting in circuit malfunction.

Figure 5:
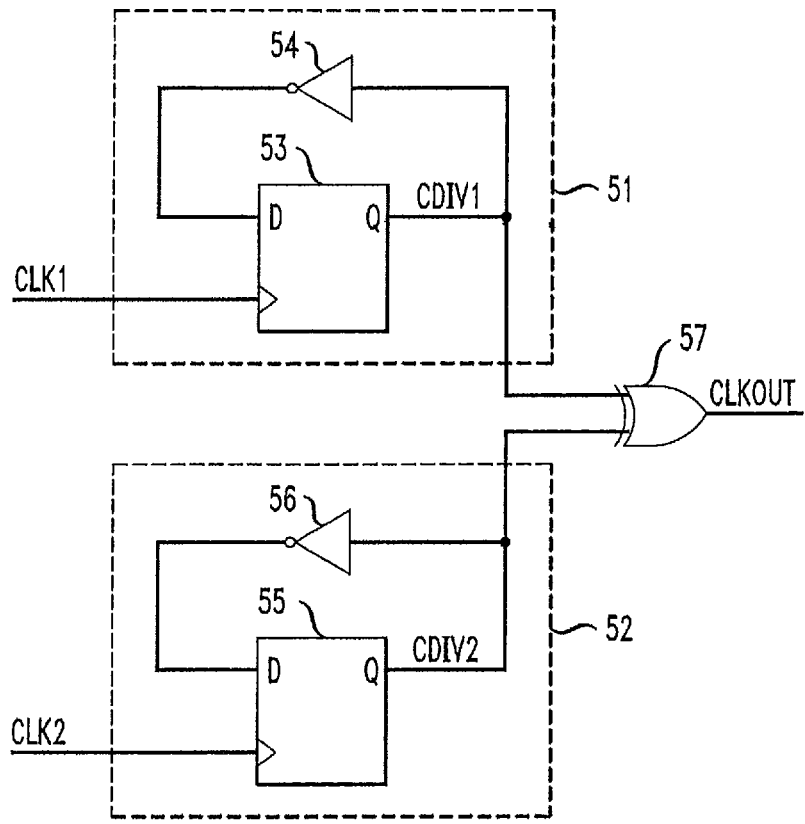
FIG. 5 is a schematic diagram of an edge selection circuit comprising two clock dividers and an XOR (exclusive-OR) gate.

FIG. 5 is a schematic diagram of an edge selection circuit comprising two clock dividers and an XOR (exclusive-OR) gate. In particular, the edge selection circuit 50 comprises a first clock divider circuit 51 and a second clock divider circuit 52. The first clock divider circuit 51 comprises a first D flip-flop 53 and a first inverter 54. The second clock divider circuit 52 comprises a second D flip-flop 55 and a second inverter 56. An XOR gate 57 is connected to the outputs of the first and second clock divider circuits 51 and 52. A first clock signal CLK1 clocks the first D flip-flop 53 and a second clock signal CLK2 clocks the second D flip-flop 55, wherein the first and second clock divider circuits 51 and 52 operate to frequency-divide the input clock signals CLK1 and CLK2, respectively, and produce output clock signals CDIV1 and CDIV2 respectively.

In the embodiment of FIG. 5, the output clock signals CDIV1 and CDIV2 have 50% duty cycle and are exactly 90 degrees apart in phase (if the rising edges of the clock signals CLK1 and CLK2 are ½ a clock cycle apart). The desired output clock signal (CLKOUT) is generated by XOR-ing the CDIV1 and CDIV2 signals, avoiding the drawbacks mentioned above regarding runt signals. However, the states of the clock dividers 51 and 52 must be properly initialized to produce an output clock with a known phase relationship with respect to the input clocks.

Figure 6:
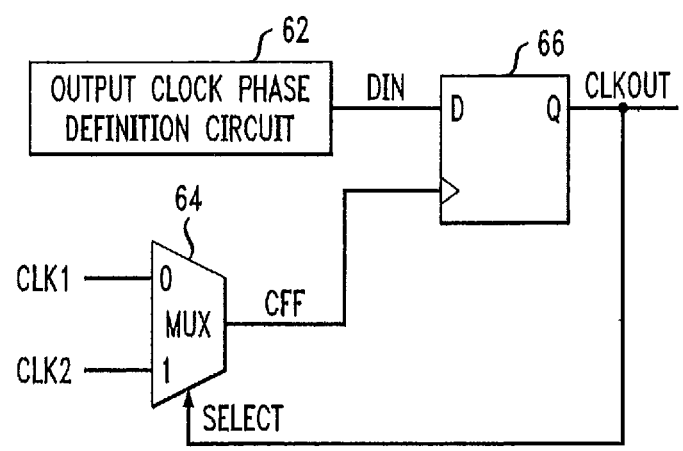
FIG. 6 is a schematic diagram of an edge selection circuit according to an exemplary embodiment of the invention.

FIG. 6 is a schematic diagram of an edge selection circuit according to an exemplary embodiment of the invention. In general, FIG. 6 shows an edge selection circuit 60 comprising an output clock phase definition circuit 62, a multiplexer circuit 64 (MUX), and an edge-triggered flip-flop 66 (e.g., D flip-flop). In the exemplary embodiment of FIG. 6, the MUX circuit 64 is a 2:1 MUX having two data inputs ("0" and "1")

that receive input clock signals CLK1 and CLK2, respectively. A signal CFF that is output from the MUX 64 serves as a clock input to the edge-triggered flip-flop 66. The signal DIN sampled by the edge-triggered flip-flop 66 is generated by the output clock phase definition circuit 62. The DIN signal is typically a clock signal with a frequency equal to that of the input clocks CLK1 and CLK2. The output of the edge-triggered flip-flop 66 is connected to a "select" control input of the MUX 64. In one exemplary embodiment, the edge-triggered flip-flop 66 is a rising edge-triggered flip-flop such that an output clock CLKOUT is synthesized by selecting the rising edges of the clock signals CLK1 and CLK2.

In particular, in operation, the MUX 64 selects between the two distorted clock signals CLK1 and CLK2 such that the rising edges of these clocks are selectively applied to the rising edge-triggered flip-flop 66. When the output of the edge-triggered flip-flop 66 is logic "0", the first clock signal CLK1 is output from the MUX 64 as the CFF signal. When the output of the edge-triggered flip-flop 66 is logic "1", the second clock signal CLK2 is output from the MUX 64 as the CFF signal. In this regard, the CFF signal is generated by selectively switching between the input clock signals CLK1 and CLK2 so that the rising edge-triggered flip-flop 66 detects the rising edges of both clock signals CLK1 and CLK2.

When the rising edge from one clock signal (CLK1 or CLK2) arrives, the edge-triggered flip-flop 66 samples the input DIN. Since the input data DIN has changed polarity (in a time-interval since the previous rising edge of the clock signals CLK1/CLK2), the output CLKOUT of the edge-triggered flip-flop 66 changes state. In response, the MUX 64 selectively outputs the other clock signal (CLK2 or CLK1) as the CFF signal, and the edge-triggered flip-flop 66 detects the rising edge of the other clock signal (CLK2 or CLK1). This process continually repeats, yielding an output clock CLKOUT whose edges (both rising and falling) coincide with the rising edges of the input clocks CLK1 and CLK2. If the rising edges of the input clocks CLK1 and CLK2 are exactly half a clock period apart, the output clock CLKOUT has 50% duty cycle.

Advantageously, the exemplary edge selection circuit 60 of FIG. 6 avoids having to generate intermediate clock signals with extreme duty cycles which act as "runt pulses" for the logic elements, a problem which hinders the robustness of certain edge selection circuits such as that shown in FIG. 4A. In other exemplary embodiments of the edge selection circuit of FIG. 6, the edge-triggered flip-flop 66 may be implemented as a falling edge-triggered flip-flop to select the falling edges of the input clocks CLK1 and CLK2.

Figure 7A:
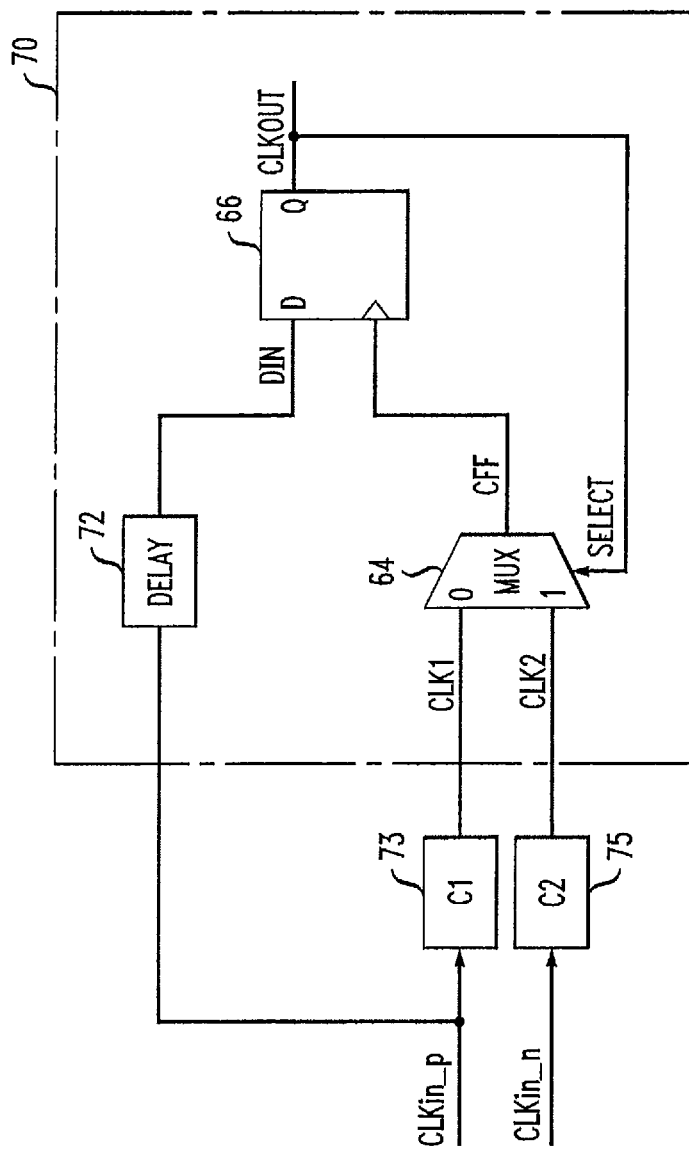
FIG. 7A is a schematic diagram of an edge selection circuit according to another exemplary embodiment of the invention.

FIG. 7A is a schematic diagram of an edge selection circuit according to another exemplary embodiment of the invention. In general, FIG. 7A shows an edge selection circuit 70 comprising a delay circuit 72, a multiplexer circuit 64 (MUX), and an edge-triggered flip-flop 66 (e.g., D flip-flop). In the exemplary embodiment of FIG. 7A, the MUX 64 and the edge-triggered flip-flop 66 operate similarly to the MUX 64 and edge-triggered flip-flop 66 of FIG. 6. In FIG. 7A, the clock signals CLK1 and CLK2 are generated and output from a first circuit 73 and a second circuit 75 based on complementary clock signals CLKin_p and CLKin_n that are input to the first and second circuits 73 and 75, respectively. In particular, in one exemplary embodiment, the first and second circuits 73 and 75 are identical circuits that act upon the complementary clock signals CLKin_p and CLKin_n, respectively, to produce the clock signals CLK1 and CLK2, which only contain useful information in their rising edges. For example, the identical first and second circuits 73 and 75 may be variable delay elements that precisely position the rising edges of their output clocks CLK1 and CLK2, but not the falling edges.

The rising edges of the clock signals CLK1 and CLK2 are selectively output from the MUX 64 as a CFF signal that clocks the edge-triggered flip-flop 66 (via the rising edges of the clock signals CLK1 and CLK2) to produce the output clock signal CLKOUT, in a similar manner as discussed above with reference to FIG. 6. The delay circuit 72 receives as input the clock signal CLKin_p and generates a data signal DIN which is sampled by the edge-triggered flip-flop 66 upon each rising edge of the first and second clock signals CLK1 and CLK2. The delay circuit 72 defines an output clock phase, since it determines the polarities of DIN when the edge-triggered flip-flop 66 is triggered by the rising edges of CLK1 and CLK2. The delay circuit 72 is configured to ensure that transitions on DIN satisfy the setup and hold time requirements of the edge-triggered flip-flop 66.

Figure 7B:
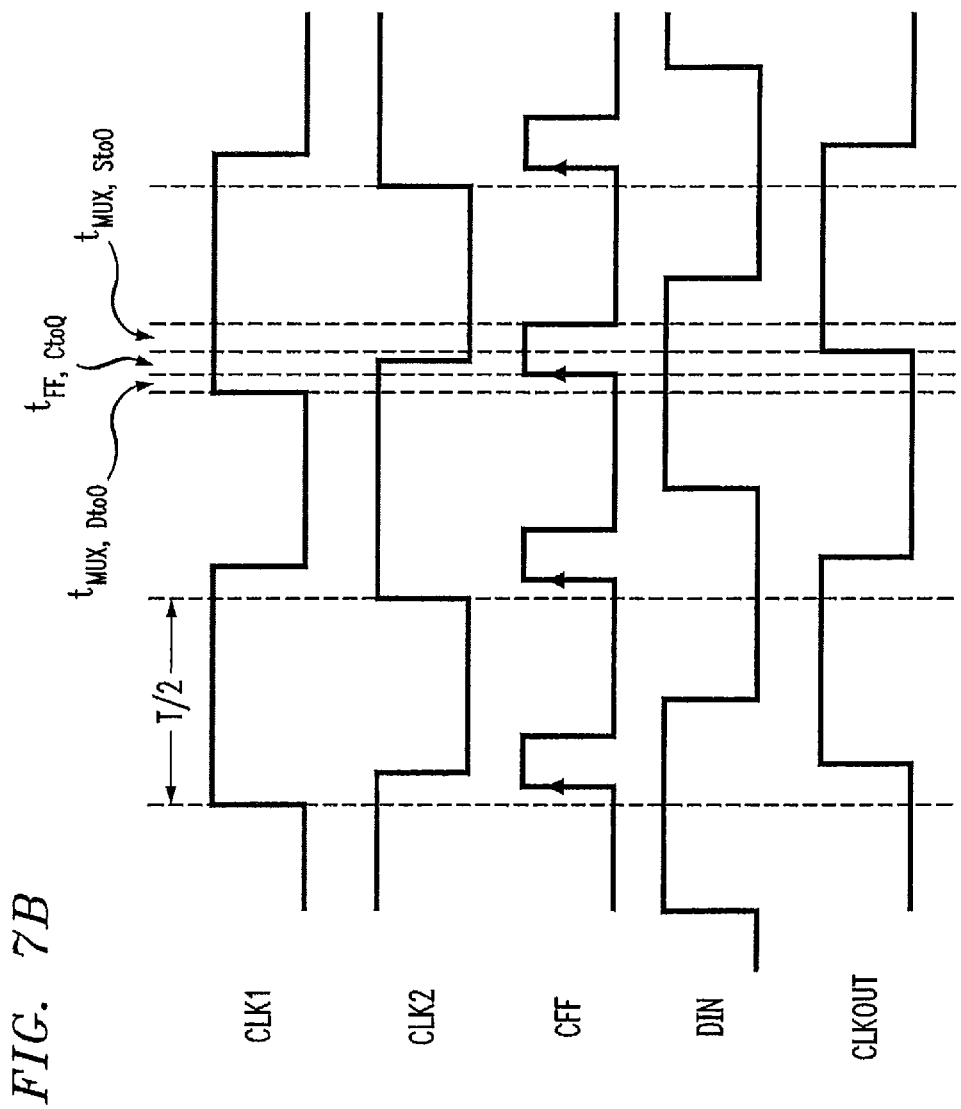
FIG. 7B is a timing diagram illustrating a mode of operation of the circuit of FIG. 7A operating as a duty cycle correction circuit.

FIG. 7B is a timing diagram illustrating a mode of operation of the circuit 70 of FIG. 7A operating as a duty cycle correction circuit. The circuit 70 of FIG. 7A can operate as a duty cycle correction circuit in a case when the first and second circuits 73 and 75 produce distorted clock signals CLK1 and CLK2 with duty cycles that are not 50%, and the output clock CLKOUT is required to have a 50% duty cycle. In FIG. 7B, the clock signals CLK1 and CLK2 are depicted as having duty cycles that are greater than 50%, but their rising edges are exactly ½ a clock period (T/2) apart. Assuming that the MUX 64 selects CLK1 when CLKOUT is low, the rising edge of CLK1 propagates to the CFF signal after the Data-to-Output propagation delay of the MUX 64 (denoted by $t_{MUX,DtoO}$). The rising edge on CFF triggers the edge-triggered flip-flop 66 that samples DIN whose polarity is high.

The output CLKOUT of the edge-triggered flip-flop 66 updates after the Clock-To-Q propagation delay ($t_{FF,CtoQ}$) of the edge-triggered flip-flop 66. This creates a rising edge of CLKOUT and causes the MUX 64 to select the other clock signal, CLK2, after the select-to-output propagation delay of the MUX ($t_{Mux,StoO}$). This causes the CFF signal to transition to logic "low" again. When the rising edge of the clock signal CLK2 arrives, the edge-triggered flip-flop 66 samples its input and since this sampling occurs one half-cycle later than the previous sampling, the edge-triggered flip-flop 66 reads the opposite polarity of DIN. Once the edge-triggered flip-flop 66 output transitions to logic "low" again, the MUX 64 is ready to read the rising edge of the clock signal CLK1 and this process repeats.

As long as the Clock-to-Q delay of the edge-triggered flip-flop 66 is the same for 0→1 transitions and 1→0 transitions, the output of the edge-triggered flip-flop 66 will be a 50% duty cycle square wave with a frequency equal to that of the clock signals CLK1 and CLK2. The widths of the CFF pulses are guaranteed to be at least $t_{FF,CtoQ}+t_{MUX,StoO}$, irrespective of the duty cycle of the input clocks CLK1 and CLK2. The CFF pulses may be wider if the inputs of the MUX 64 are both logic "high" when the SELECT control signal changes polarity. This makes the framework of FIG. 7A robust against process variations and avoids complications that may stem from extreme duty cycles in the CFF signal.

Figure 8:
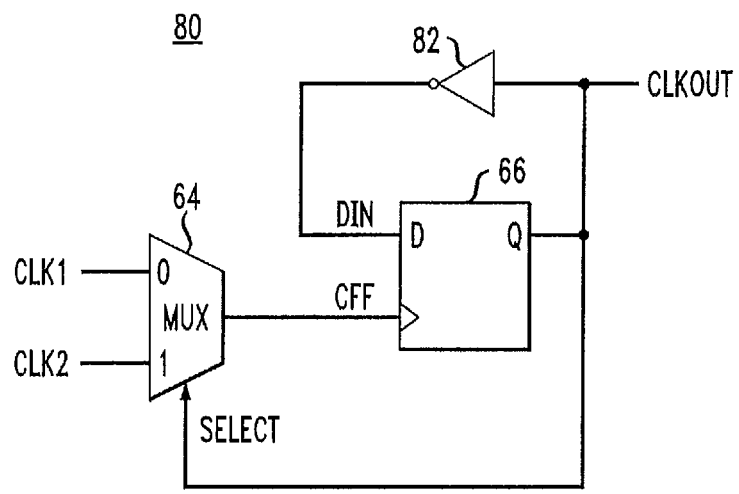
FIG. 8 is a schematic diagram of an edge selection circuit according to another exemplary embodiment of the invention, which employs an inverter for determining the output clock phase.

FIG. 8 is a schematic diagram of an edge selection circuit according to another exemplary embodiment of the invention. In particular, FIG. 8 depicts an edge selection circuit 80 that comprises a MUX 64 and edge-triggered flip-flop 66 similar to the edge selection circuit 60 of FIG. 6, but wherein the edge selection circuit 80 of FIG. 8 further comprises an inverter 82 for generating a DIN signal that determines the phase of the output clock signal CLKOUT. In the exemplary embodiment of FIG. 8, the edge-triggered flip-flop 66 and the inverter 82 form a clock divider circuit that is clocked by the CFF clock signal. The operation of the circuit 80 of FIG. 8 is similar to the circuit embodiments discussed above in FIG. 6 and FIG. 7A.

In particular, if the output clock signal CLKOUT is logic "low," the SELECT signal input to the MUX 64 is logic "low," which causes the MUX 64 to select the CLK1 clock path. When there is a rising edge on the clock signal CLK1, the edge-triggered flip-flop 66 samples the input signal DIN, which causes the output clock signal CLKOUT to transition to logic "high", which then causes the MUX 64 to select the CLK2 clock path. Since the rising edges on the output clock signal CLKOUT are generated by the rising edge on CLK1, there is a well-defined phase relationship between the input and output clocks. When there is a rising edge on CLK2, the output clock signal CLKOUT transitions to logic "low" and the MUX 64 selects the CLK1 clock path, and the entire process repeats. Thus, the output clock signal CLKOUT is a clock signal that transitions to logic "high" on the rising edge of CLK1 and transitions to logic "low" on the rising edge of CLK2. If the rising edges of CLK1 and CLK2 are ½ a clock period apart, the output clock signal CLKOUT will have a 50% duty cycle.

Figure 9:
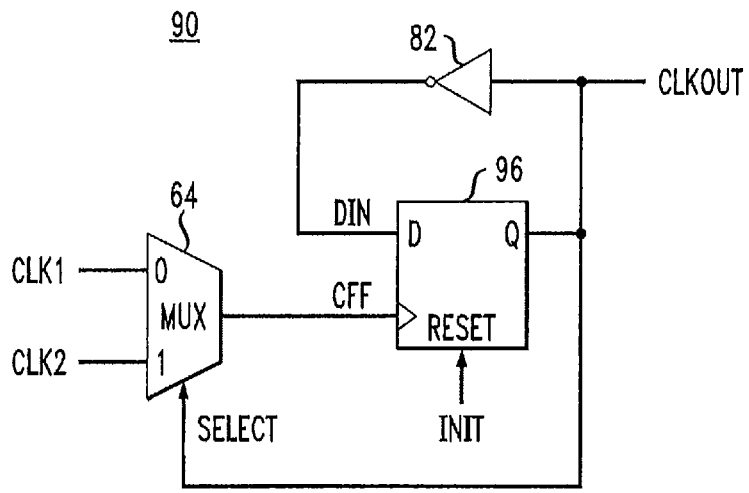
FIG. 9 is a schematic diagram of an edge selection circuit according to another exemplary embodiment of the invention, which employs an asynchronously resettable flip-flop.

FIG. 9 is a schematic diagram of an edge selection circuit according to another exemplary embodiment of the invention. In particular, FIG. 9 depicts an edge selection circuit 90 that comprises a MUX 64 and inverter 82 similar in function and architecture to the edge selection circuit 80 of FIG. 8, but wherein the edge selection circuit 90 of FIG. 9 further comprises an asynchronously resettable edge-triggered flip-flop 96 having a reset input that is responsive to an reset control signal INIT. The asynchronously resettable edge-triggered flip-flop 96 is useful in some systems where the clock may be de-activated and then activated again (for example, clock-gating), and the system requires the edge selection circuit to be in a known state so that it generate a well-defined first pulse. The output clock signal CLKOUT is held static as long as the INIT signal is asserted (e.g., logic "high"). When the INIT signal is de-asserted (e.g., logic "low"), the output clock signal CLKOUT starts toggling as per the operating sequence described above.

For sake of illustration, the operation of the embodiments has been described using the rising-edge transitions of the input clocks. However, principles of the invention are equally applicable to embodiments that respond to the falling-edge transitions of the input clocks. This can be achieved by employing falling edge-triggered flip-flops in the exemplary embodiments discussed above in FIGS. 6, 7A, 8 and 9.

Further aspects of the present invention provide edge selection circuits which can be utilized in integrated circuit chips with various analog and digital integrated circuitries. In particular, integrated circuit dies can be fabricated having edge selection circuits and other semiconductor devices such as field-effect transistors, bipolar transistors, metal-oxide-semiconductor transistors, diodes, resistors, capacitors, inductors, etc., forming analog and/or digital circuits. The edge selection circuits can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered a part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A circuit for generating a clock signal, comprising:
a multiplexer circuit to selectively output one of a plurality of input clock signals;
an edge-triggered flip-flop circuit comprising a clock signal port, a data signal port, and an output port, wherein the clock signal port is directly connected to an output of the multiplexer circuit, wherein the data signal port receives a data signal, and wherein the output port of the edge-triggered flip-flop is directly connected to a select control port of the multiplexer circuit, and
a clock phase definition circuit that generates the data signal which is input to the data input port of the edge-triggered flip-flop, wherein the data signal is a clock signal having a frequency equal to a frequency of the input clock signals,
wherein the edge-triggered flip-flop detects a transitioning edge of an input clock signal that is selectively output from the multiplexer circuit, and in response to said detection, samples a logic level of the received data signal, and generates a transition of an output clock signal at the output port, and
wherein the multiplexer circuit selectively outputs one of the plurality of input clock signals to the clock signal port of the edge-triggered flip-flop, based on a logic level of the output clock signal at the output port of the edge-triggered flip-flop, which output clock signal is directly input to the select control port of the multiplexer circuit.

2. The circuit of claim 1, wherein the edge-triggered flip-flop circuit detects a rising edge of the input clock signal selectively output from the multiplexer circuit.

3. The circuit of claim 1, wherein the edge-triggered flip-flop circuit detects a falling edge of the input clock signal selectively output from the multiplexer circuit.

4. The circuit of claim 1, wherein the multiplexer circuit is a 2:1 multiplexer.

5. The circuit of claim 1, wherein the clock phase definition circuit comprises a delay circuit that generates a data input signal by delaying at least one of the input clock signals.

6. The circuit of claim 1, wherein the edge-triggered flip-flop is an asynchronously resettable edge-triggered flip-flop.

7. The circuit of claim 1, wherein the plurality of input clock signals are clock signals with distorted duty cycles, and wherein the circuit corrects the duty cycles of the input clock signals by using the multiplexer circuit to select transitioning edges of the input clock signals that are substantially equally spaced in time, and by using the selected transitioning edges to trigger the edge-triggered flip-flop to generate an output clock signal at the output port which is substantially free of duty cycle distortion.

8. A method for generating a clock signal, comprising:
selecting between one of a plurality of input clock signals, based on a logic level of an output clock signal;
detecting a transitioning edge of the selected one of the plurality of input clock signals;
generating a data signal having a frequency equal to a frequency of the plurality of input clock signals;

sampling a logic level of the data signal in response to said detecting;
changing the logic level of the output clock, based on the sampled logic level of the data signal; and
selecting another one of the plurality of input clock signals, in response to said changing of the logic level of the output clock.

9. The method of claim 8, wherein a sequence of the selecting, detecting, sampling, changing and selecting steps is repeated, wherein a first input clock signal is selected when the output clock signal transitions to a first logic level and wherein a second input clock signal is selected when the output clock signal transitions to a second logic level.

10. The method of claim 8, wherein detecting a transitioning edge comprises detecting a rising edge of the selected one of the plurality of input clock signals.

11. The method of claim 8, wherein detecting a transitioning edge comprises detecting a falling edge of the selected one of the plurality of input clock signals.

12. The method of claim 8, wherein said detecting, sampling, and changing steps are performed by an edge-triggered flip-flop.

13. The method of claim 12, wherein the edge-triggered flip-flop is an asynchronously resettable edge-triggered flip-flop.

14. The method of claim 8, wherein each of the plurality of input clock signals is generated with a corresponding one of a plurality of identical circuits.

15. The method of claim 8, wherein the plurality of input clock signals are clock signals with distorted duty cycles, wherein the method further comprises correcting the duty cycles of the input clock signals by detecting transitioning edges of the input clock signals that are substantially equally spaced in time to generate an output clock signal which is substantially free of duty cycle distortion.

* * * * *